US006278341B1

(12) United States Patent
Lindqvist

(10) Patent No.: US 6,278,341 B1
(45) Date of Patent: Aug. 21, 2001

(54) MICROSTRIP FILTER DEVICE

(75) Inventor: Leif Lindqvist, Åkersberga (SE)

(73) Assignee: Allgon AB, Åkersberga (SE)

( * ) Notice: Subject to any disclaimer, the term of this patent is extended or adjusted under 35 U.S.C. 154(b) by 0 days.

(21) Appl. No.: 09/334,919

(22) Filed: Jun. 17, 1999

(30) Foreign Application Priority Data

Dec. 1, 1998 (SE) .......... 9804153

(51) Int. Cl.[7] .......... H03H 11/34; H01P 1/203; H01P 1/205

(52) U.S. Cl. .......... 333/126; 333/204; 333/202; 333/134

(58) Field of Search .......... 333/203, 204, 333/129, 126, 132, 202

(56) References Cited

U.S. PATENT DOCUMENTS

| | | | | |
|---|---|---|---|---|
| 2,945,195 | * | 7/1960 | Matthaei | 333/204 |
| 2,964,718 | * | 12/1960 | Packard | 333/204 |
| 3,104,362 | * | 9/1963 | Matthaei | 333/204 |
| 5,153,541 | | 10/1992 | Johnson et al. | 333/203 |
| 5,153,542 | | 10/1992 | Tai et al. | 333/204 |

* cited by examiner

*Primary Examiner*—Justin P. Bettendorf
*Assistant Examiner*—Stephen E. Jones
(74) *Attorney, Agent, or Firm*—Jacobson Holman, PLLC

(57) ABSTRACT

The present invention provides a filter for achieving a small, low cost filter means for high-power applications. This is achieved by providing a filter comprising a first and a second signal port 101, 102 arranged to pass signals of said first frequency band and at least a first ground plane means. The filter further comprising an elongated conductor, 111, coextending substantially in parallel with the ground plane means providing a first signal path for said frequency band between the first and second ports, at least a first conductive segment, 107, having first radio frequency characteristics and being connected to the signal path at a first interconnection point and where the first characteristics and the position of the first interconnection point being selected such that radio frequencies outside the first frequency band are effectively attenuated in the first signal path. The filter being characterized in that the elongated conductor and the conductive segment being formed partly by a planar dielectric material, having a relative dielectric constant substantially greater than one, provided with a conductive pattern and partly by a self supporting conductor, the first interconnection point and the ground plane means being separated by a dielectric in the form of a gas.

11 Claims, 4 Drawing Sheets

MICROSTRIP FILTER DEVICE

TECHNICAL FIELD OF INVENTION

The present invention relates in general to a filter and more particularly to a microstrip filter.

DESCRIPTION OF RELATED ART

The continued growth of subscribers in different cellular systems has led to a situation where the call intensity, in peak traffic hours, reaches a maximum number of simultaneous calls due to limited frequency band availability. Thus, an operator might be restricted in adding new subscribers to the cellular system. This is solved by introducing new frequency bands used for communication. For instance, the mobile telephone system band 900 Mhz is supplemented in some areas by PCS/GSM 1800 Mhz. A subscriber having a dual band cellular phone may thus use any of the two frequency bands for communication resulting in less congestion, and the operator may add more subscribers to the combined system and will thus reach even more revenues.

The use of two different frequency bands by one operator may require the operator to use two different antennas, one for each frequency band. However, it is beneficial for the operator to use the same cables to and from the two antennas, or a dual band antenna, serving a specific geographic area, and thus the need for a combiner or a filter for separating the different frequency bands arises.

Conventionally, such high-power filters may, for instance, be designed using cavity resonator filters according to known techniques. Such filters have generally been satisfactory in function but are bulky, expensive and require manual tuning for optimal performance. Another example of a conventional high-power filter comprises a wire transmission line along a central axis of a cylindrical metal housing. The transmission line is connected to a series of circular metal plates that perpendicularly intersect the line. The plates are circumferentially spaced apart from the grounded housing by a dielectric material to create a capacitive coupling effective to shunt high frequencies. Such filters have also been generally satisfactory for suppressing harmonic spurs or high frequencies, but are massive in construction and expensive. It would be beneficial if a filter could be designed which is easy to manufacture, which does not require manual tuning, and which is smaller and less costly.

These requirements could be met by a microstrip, or a stripline, filter. However, microstrip filters are generally not suitable for high-power filter applications due to, for instance, high insertion loss, which reduces the power of the signal beyond acceptable values.

In U.S. Pat. No. 5,153,541 to Johnson et al and titled 'Multidielectric Microstrip Filter', assigned to Motorola Inc, a high-power microstrip filter is disclosed. Two different dielectric materials separate a transmission line and the ground plane, and radial pads, and the ground plane, respectively. The radial pads cooperate, through a first of the two dielectric materials, with the ground plane for attenuating harmonic spurs. Along the transmission line are several apertures positioned, filled with a second of said two dielectric materials, preferably air, which reduces the capacitive coupling with the ground plane.

The use of several apertures interposed with support parts for supporting the transmission line results in a somewhat cumbersome solution. The support parts are necessary, according to the cited patent, for supporting the transmission line and for enabling conductive coupling between the transmission line and the radial pads. One problem which might occur with this arrangement is that the support parts also introduce an increased capacitive coupling, caused by the circuit board at those points where high currents occur and where, possibly, the best need for a reduced capacitive coupling is present. It would be beneficial if this capacitive coupling, at the support parts, could be reduced.

It may also be very difficult to selectively vary the characteristic impedance along the transmission line, which in turn may impede the freedom of design. It would be beneficial if the freedom in designing the filter characteristics could be increased.

The design in U.S. Pat. No. 5,153,542 to Tai et al is also a broad-band design meaning that the filter is used for attenuating signals in a very broad frequency band above the low-pass frequency band. This filter design requirement may cause restrictions on the building practice.

SUMMARY OF INVENTION

The main object of the present invention is to achieve a high-power filter for filtering a first frequency band. The filter should be small, capable of handling high-power applications, and easy and inexpensive to manufacture.

Another object of the present invention, according to a preferred embodiment, is to provide a high-power filter which has an increased freedom in design of filter characteristics.

In more detail, the problems described above, concerning how to achieve a small, low cost filter for high-power applications, are solved by providing a filter comprising a first and a second signal port arranged to pass signals of the first frequency band and at least a first ground plane means, the filter further comprising an elongated conductor coextending substantially in parallel with the ground plane means providing a first signal path for the frequency band between the first and second ports, at least a first conductive segment having first radio frequency characteristics and being connected to the signal path at a first interconnection point and where the first characteristics and the position of the first interconnection point being selected such that radio frequencies outside the first frequency band are effectively attenuated in the first signal path and the filter being characterized in that the elongated conductor and the conductive segment are formed partly by a planar dielectric material, having a relative dielectric constant substantially greater than one, provided with a conductive pattern, and partly by a self supporting conductor, the first interconnection point and the ground plane means being separated by a dielectric in the form of a gas.

According to one embodiment of the invention, the radio frequency characteristics are selected such that signals in a second frequency band above the first frequency band is effectively attenuated.

The objects of the present invention, according to one embodiment, are obtained by providing a filter where the signal path has narrower and broader parts to form different characteristic impedance along the signal path and where the characteristic impedance of the signal path cooperates with the frequency characteristics of the conductive segment to attenuate frequencies in at least a second frequency band above the first frequency band.

An advantage with the present invention is that a small, low-cost filter is achieved.

A further advantage is that a relative robust conductive material can be used where the current has its peak values and a material of high dielectric strength can be used where the electric field reaches high values. Thereby, a further advantage is achieved, namely that the losses can be kept low and the power handling capabilities can be kept high.

If the dielectric material is a printed circuit board, then high mechanical tolerances can be maintained which is a basis for making a tuning free filter.

Another advantage is that a transmission line, which is capable of handling high-power signals, is achieved.

Another major advantage is that the relation between the distance to the ground plane and the width of the conducting portions can be chosen according to need or desire.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF PREFERRED EMBODIMENTS

Figure 1:
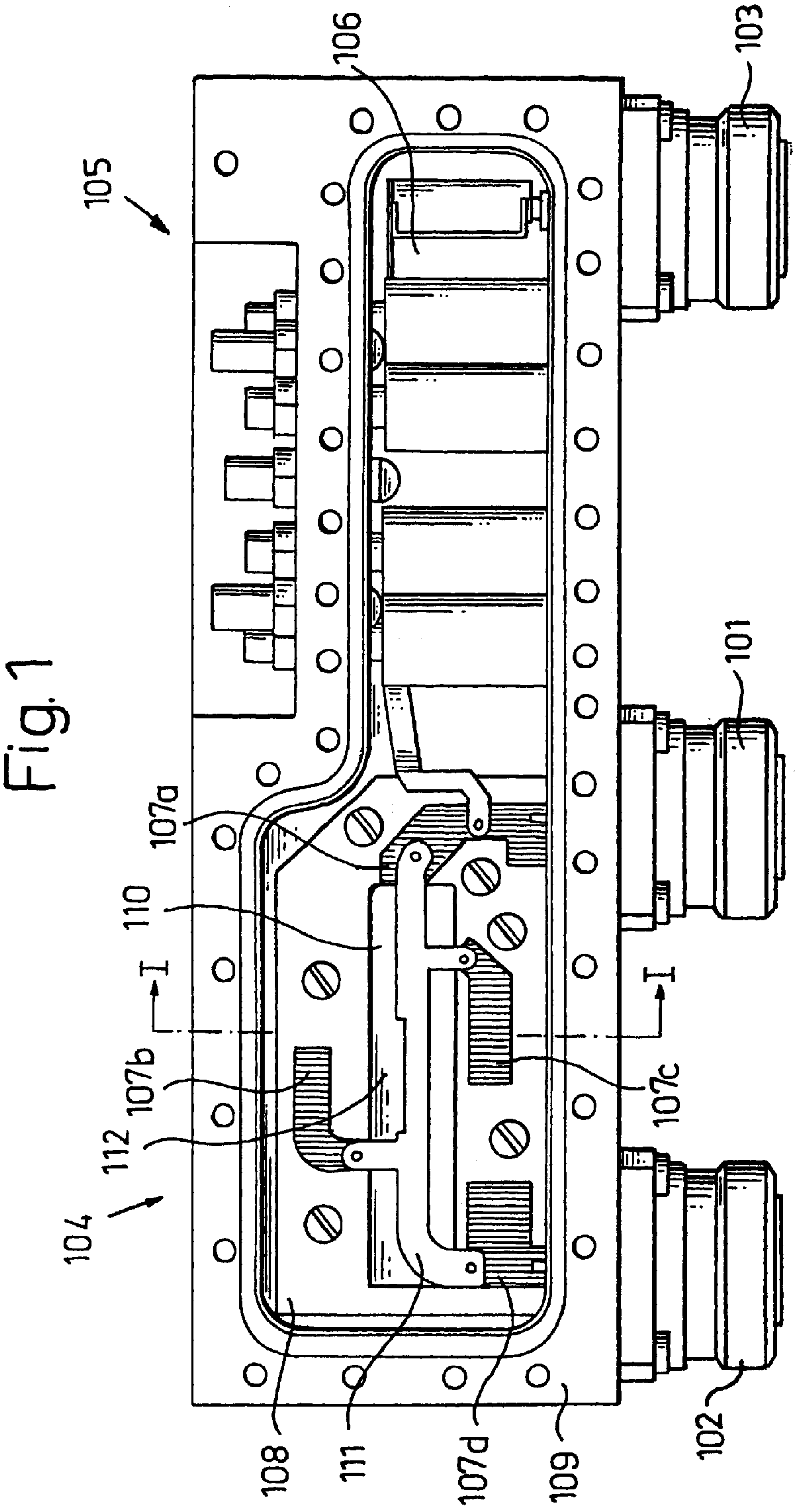
FIG. 1 shows a combiner/splitter means according to a preferred embodiment of the invention.

FIG. 1 illustrates a filter according to a preferred embodiment of the invention, with the lid removed for sake of clarity. The filter comprises a first input means 101 and first output means 102 and second output means 103. The input signal comprises at least two different frequency bands, in this preferred embodiment the GSM band which is located at 900 Mhz and the PCN band which is located at 1800 Mhz. It is however possible to apply the invention to other specific frequency bands also. The input signal is fed to a first low-pass filter arrangement 104, which will be further described below, and a second band-pass filter arrangement 105. The second filter arrangement, for filtering the input signal according to a second filtering scheme, receives the input signal through the input means 101 and passes it through a number of coaxial resonators 106 resulting in a signal which is band-pass filtered to let through the PCN band of 1800 Mhz. Such a filter arrangement is known per se and is not further described here.

It shall be noted that, even though input and output means have generally conveniently been used for describing the operability in a simple and easy to understand manner, the device described is a duplex device. Thus, the terms input and output means used are not intended to indicate any direction of signal propagation, but rather the signals may propagate from an output means to an input means.

The first filter arrangement, for filtering the input signal according to a first scheme, receives the input signal at the input means 101. The signal is further transferred on a conductive pattern or conductive stub segment 107 on a printed circuit board 108 towards an opening or an aperture 110 on the printed circuit board 108. The printed circuit board is secured on a metallic or, more generally, a conductive body 109 with bolts, screws, an adhesive or any other suitable fastening means. The conductive body 109 is effectively a ground plane at a first distance from the conductive pattern or conductive stub segment 107. As an alternative, the ground plane may be affixed on the printed circuit board at an opposite side to the conductive pattern or conductive stub segment 107. The conductive pattern 107 consists, in this preferred embodiment, of four disjoint parts or conductive stub segments, 107*a–d,* these stub segments are open-ended.. In other embodiments, more or fewer parts may be employed.

In conductive contact with all the disjoint parts 107*a–d* of the conductive pattern 107 and positioned over the opening or aperture 110 is a stiff conductive transmission line 111 in the form of a conductive plate. Aligned with the opening or aperture 110 is also a recess in the conductive body 109 forming the ground plane, so that the transmission line 111 has a second distance to the ground plane which is larger than the first distance. The transmission line 111 comprises protruding parts which are soldered to the end portions of the conductive pattern 107 so that a conductive coupling is achieved. Other means of achieving this coupling may include conductive adhesive agents, bolts, screws or any other fastening means. The transmission line has broader and narrower passages 112, and the parts 107*b* and 107*c,* together with the protruding parts, form stubs, in order to achieve the desired filtering, according to known techniques. The part 107*d* of the conductive pattern 107 connects the transmission line 111 to the output means 102.

The stiff conductive transmission line can be achieved by for instance etching, which gives a very high precision, or punching or in any other way known to the man skilled in the art.

Figure 2:
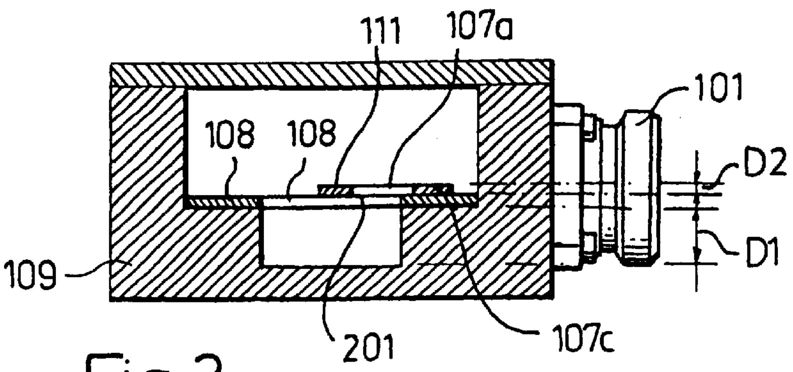
FIG. 2 shows a cross sectional view of the combiner/splitter means in FIG. 1 taken at line I—I.

FIG. 2 shows a cross section of FIG. 1 at line I—I. In this view the distance D1 between the transmission line 111 and the conductive body 109, and the distance D2 between the conductive pattern 107 and the conductive body 109, which forms the ground plane, are clearly visible. An interconnection point 201 connects the transmission line 111 with the conductive pattern 107*a*. Such an interconnection point is present for all disjoint parts of the conductive pattern 107 with the transmission line. These are all located so that air separates the interconnection point 201 and the ground plane 109. This is one significant step in achieving a high power filter since high currents may occur in these points. It shall be noted that an interconnection point is not necessarily the same as a soldering point. The interconnection point simply indicates the position where the transmission line interfaces the stubs, which, in this particular preferred embodiment, are formed by the protruding parts of the stiff conductive transmission line together with the disjoint parts, and has nothing to do with how the electrical or mechanical connection between the two is achieved.

Figure 3:
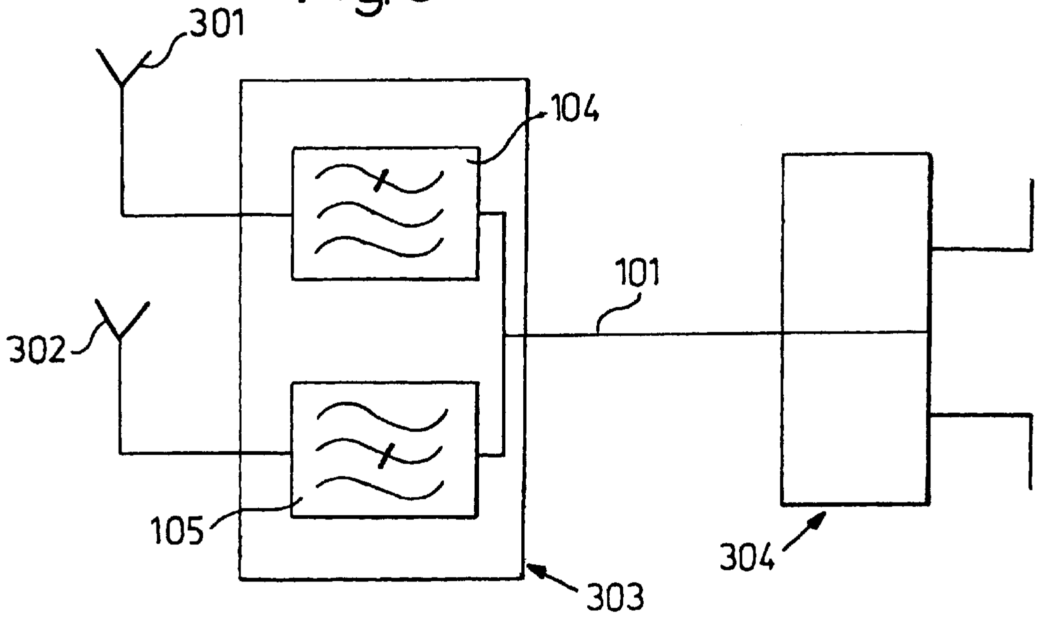
FIG. 3 shows a schematic view of the embodiment depicted in FIG. 1.

FIG. 3 shows a schematic view of the preferred embodiment according to the invention. The low-pass filter 104 is connected to a first antenna 301 adapted for transmitting and receiving signals in a first frequency, in this embodiment around 800 Mhz for the GSM band. The band-pass filter 105 is similarly connected to a second antenna 302 adapted for transmitting and receiving signals in a second frequency band, in this embodiment around 1800 Mhz for the PCN band. Both filters 104 and 105 are connected to a common input means 101. A transmission line connects the first combiner/splitter 303 to a second similar combiner/splitter 304 for further transmission of the different frequency bands. Thus, a single transmission line may be used for transmitting signals in the two frequency bands.

Figure 4:
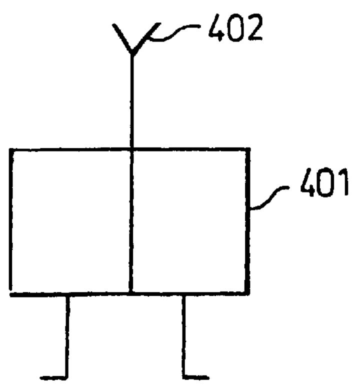
FIGS. 4, 5*a* and 5*b* show schematic views of different applications of the combiner/splitter according to preferred embodiments of the invention.

FIG. 4 shows a different arrangement where a dual band antenna means 402 is used. In this case only one combiner/splitter 401 is used.

Figure 5A:
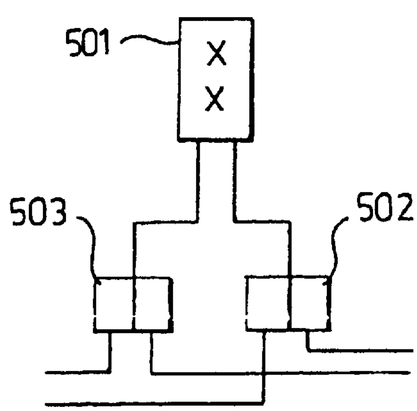
Figure 5B:
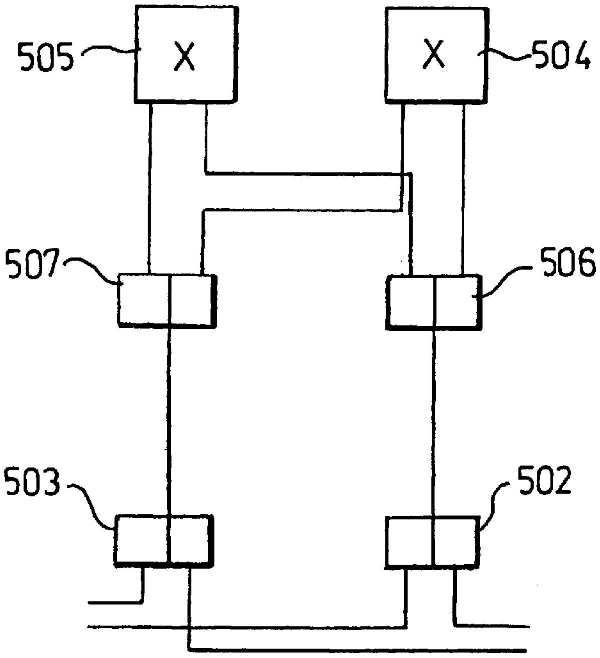

FIG. 5*a* shows an arrangement where a dual band, dual polarization antenna 501 is used. A first and a second combiner/splitter 502, 503 are used, one for each polarization. FIG. 5*b* shows an arrangement where two dual polarization antennas 504, 505 are used, one for each frequency band. Thus, two further combiners/splitters 506, 507 are required.

Although one filter has been described as a low-pass filter and the other as a band-pass filter in this embodiment, it is obvious for the person skilled in the art that many types of different filters can be designed using the inventive concepts in the present disclosure. For instance, band-stop filters may be implemented, or two band-pass filters or any other combination suitable for achieving the filter schemes desired.

Figure 6:
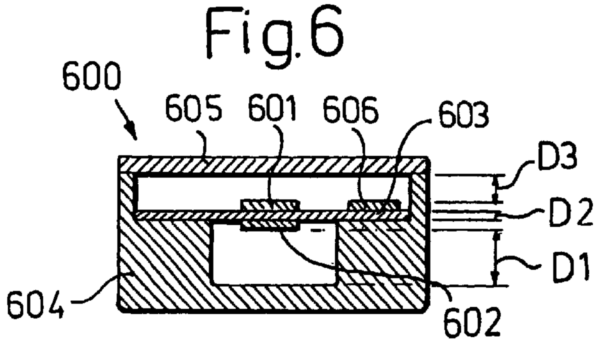
FIGS. 6, 7 and 8 show cross sectional views of combiners/splitters according to further preferred embodiments of the invention.

FIG. 6 shows a cross sectional view of another preferred embodiment according the invention. In this embodiment, a transmission line has a first and a second conductive strip 601 and 602 on opposite sides of a printed circuit board 603. The second conductive strip cooperates with a conductive body 604 having a recess and forming a ground plane at a distance D1 from the second strip 602. The filter 600 also comprises a lid 605, in conductive contact with the conductive body and thus being a part of the ground plane, cooperating with the first conductive strip 601 at a distance D3. The lid 605 and the conductive body 604 form a housing for the filter. The filter further comprises conductive stubs 606 at a distance D3 from the ground plane.

By using the housing as a ground plane means for the filter arrangement 600, inter-modulation problems can be avoided. It has been noted that using a conventional circuit board having a copper plated backside may cause inter-modulation problems when arranged in a housing. The simple, yet ingenious, solution is to use a conductive grounded housing as ground plane.

Figure 7:
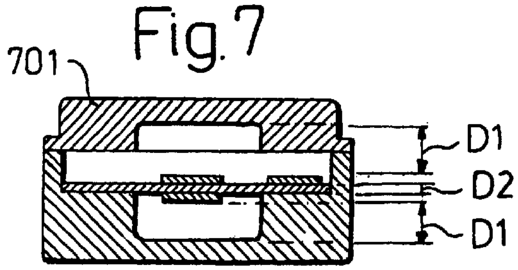

FIG. 7 shows a cross sectional view of another preferred embodiment according to the invention. In this embodiment, the distance D3 has been selected to be equal to the distance D1 in FIG. 6 by designing a lid 701 to have a recess. In all other aspects the embodiment in FIG. 7 is the same as the embodiment in FIG. 6.

Figure 8:
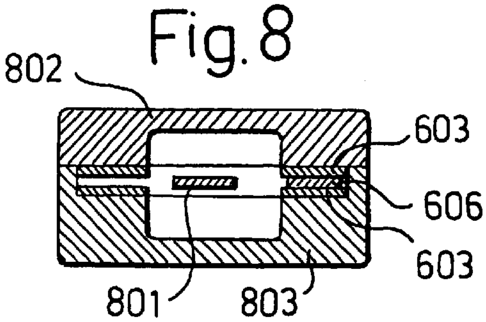

FIG. 8 shows a preferred embodiment where a stripline is used, the most significant difference being that a symmetric cross section has been achieved. Thus, the conductive stubs 606 have same material 603 with a relative high dielectric constant on both sides facing the ground plane means, whereas the transmission line 801 is separated, from both of the ground plane means 802, 803 by air.

Figure 9:
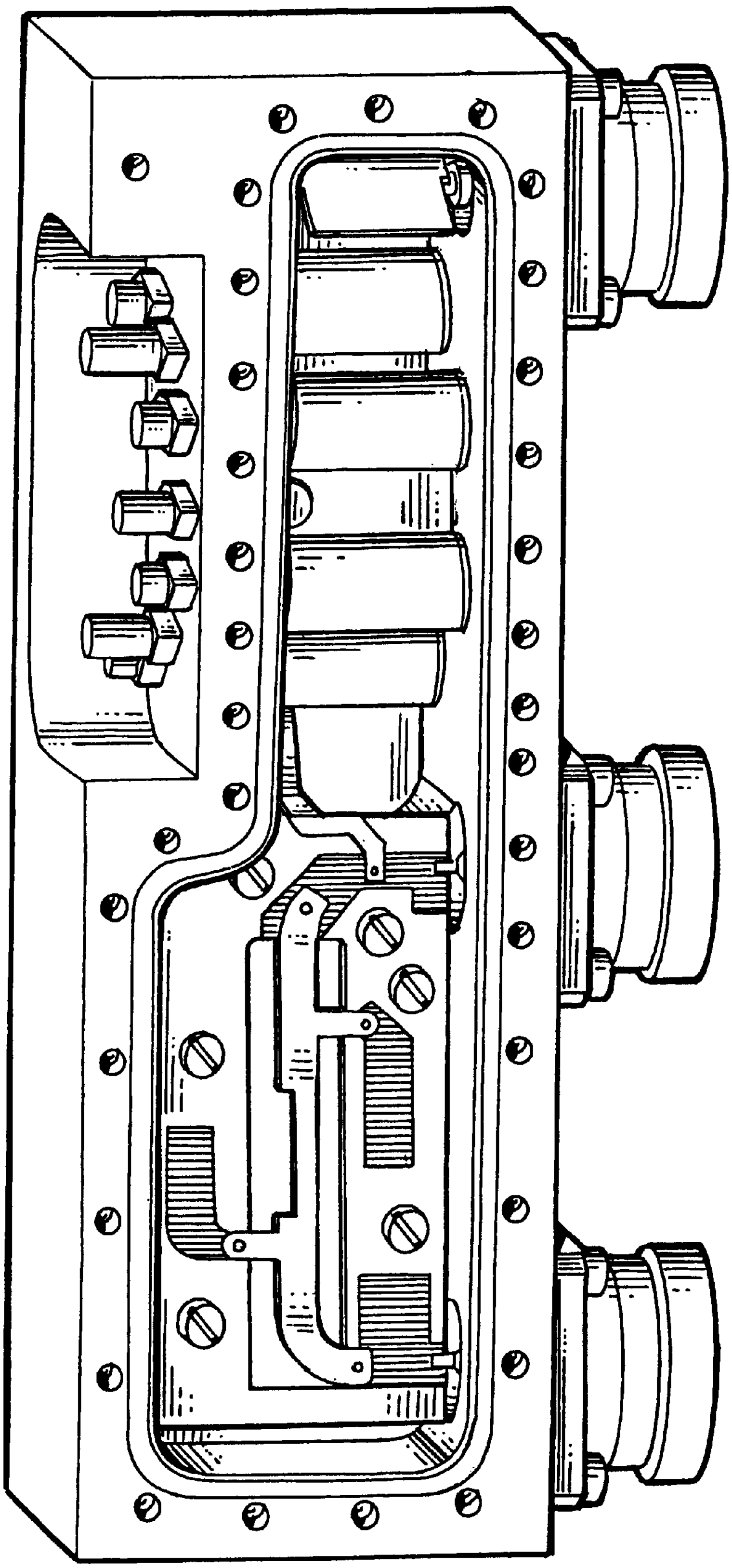
FIG. 9 shows a perspective view of the preferred embodiment of the invention disclosed in FIG. 1.

FIG. 9 discloses the same preferred embodiment as shown in FIG. 1, also here with the lid removed for sake of clarity.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A filter including a first filter portion for passing radio frequency signals of a first and second frequency band, comprising:

a first signal port arranged to pass signals of the first and second frequency band, a second signal port arranged to pass signals of the first frequency band, at least a first signal ground plane, a first elongated conductor coextending substantially in parallel with the signal ground plane providing a first transmission line for the first frequency band between the first and second ports, at least one conductive stub segment, each having radio frequency characteristics and being connected to the first elongated conductor at an interconnection point, said radio frequency characteristics and each interconnection point being selected such that radio frequencies outside said first frequency band are effectively attenuated in said first transmission line, said filter being arranged in a housing forming at least a part of the signal ground device, said first elongated conductor and said at least one conductive stub segment being formed partly by a conductive pattern on a planar dielectric material, having a relative dielectric constant substantially greater than one, and a self supporting conductor being separated from the signal ground plane by a second dielectric having approximately the same dielectric constant as vacuum, and the at least one conductive stub segment being open-ended.

2. The filter according to claim 1, wherein the second dielectric is air.

3. The filter according to claim 1, wherein the planar dielectric material is secured to the housing so that said at least one conductive stub segment is positioned at a first distance from a wall of said housing, and said self supporting conductor and each interconnection point is positioned at a second distance from a wall of said housing.

4. The filter according to claim 1, wherein said at least one conductive stub segment is separated by a first distance from the signal ground plane, said self supporting conductor is separated by a second distance from the signal ground plane, and said first and second distances are different.

5. The filter according to claim 1, wherein said self supporting conductor comprises distributed components in the form of narrower and broader parts, said distributed components cooperate with said radio frequency characteristics and each interconnection point to effectively attenuate frequencies outside said first frequency band.

6. The filter according to claim 1, wherein said at least one conductive stub segment extends at least partly in parallel with the self-supporting conductor.

7. The filter according to claim 1, wherein at least one further filter portion is arranged in the housing having said first signal port in common with said filter portion and a further third signal port, and said at least one further filter is arranged for attenuating signals outside a second frequency band.

8. The filter according to claim 1, wherein a second elongated conductor coextends substantially in parallel, and cooperating, with said signal ground plane and with said first elongated conductor to form said transmission line, said first elongated conductor being applied to a first side of the planar dielectric material, and said second elongated conductor being applied to a second side, opposite said first side, of the planar dielectric material.

9. The filter according to claim 8, wherein said at least first signal ground plane faces said first elongated conductor at a first distance, a second signal ground plane faces said second elongated conductor at a second distance.

10. The filter according to claim 9, wherein said first and second distances are different.

11. The filter according to claim 1, wherein said first transmission line comprises said self supporting conductor and, at the ends thereof, adjoining conductive segments forming parts of said conductive pattern on the planar dielectric material.

* * * * *